United States Patent [19]

Bryant et al.

[11] Patent Number: 5,057,463

[45] Date of Patent: Oct. 15, 1991

[54] THIN OXIDE STRUCTURE AND METHOD

[75] Inventors: Frank R. Bryant, Denton; Fu-Tai Liou, Carrollton, both of Tex.

[73] Assignee: SGS-Thomson Microelectronics, Inc., Carrollton, Tex.

[21] Appl. No.: 486,121

[22] Filed: Feb. 28, 1990

[51] Int. Cl.$^5$ ........................................ H01L 21/316
[52] U.S. Cl. .................................. 437/238; 437/235; 437/239; 148/DIG. 118
[58] Field of Search .............. 437/228, 235, 238, 239, 437/243, 40, 41, 919; 148/DIG. 118; 427/255.1, 255.2, 255.3

[56] References Cited

U.S. PATENT DOCUMENTS

| | | | |
|---|---|---|---|
| 4,518,630 | 5/1985 | Grasser | 437/238 |
| 4,551,910 | 11/1985 | Patterson | 437/228 |
| 4,746,625 | 5/1988 | Morita et al. | 437/238 |
| 4,784,975 | 11/1988 | Hofmann et al. | 437/238 |
| 4,894,353 | 1/1990 | Ibok | 437/238 |
| 4,906,595 | 3/1990 | van der Plas et al. | 437/238 |

FOREIGN PATENT DOCUMENTS 0140234  11/1980  Japan .

OTHER PUBLICATIONS

Steinberg, "Dual HCl Thin Gate Oxidation Process", J. Electrochem. Soc., vol. 129, No. 8, Aug. 1982, pp. 1778-1782.
Hashimoto et al., "A Method of Forming Thin Highly Reliable Gate Oxides—Two Step HCl Oxidation", J. Electrochem. Soc., vol. 127, No. 1, Jan. 1980, pp. 129-135.
Bhattacharyya et al., "A Two Step Oxidation Process to Improve the Electrical Breakdown Properties of Thin Oxides", J. Electrochem Soc., vol. 132, No. 8, pp. 1900-1903, Aug. 1985.
Liou et al., "A 0.8-$\mu$m CMOS Technology of High Performance ASIC Memory and Channelless Gate Array", IEEE J. of Solid State Circuits, vol. 24, No. 2, Apr. 1989, pp. 380-387.
Sunami et al., "Intermediate Oxide Formation in Double Polysilicon Gate MOS Structure", J. Electrochem. Soc., vol. 127, No. 11, Nov. 1980, pp. 2499-2506.
Bryant et al., "Thin Gate Oxides Grown in Argon Diluted Oxygen With Steam and HCl Treatment", Proc. Electrochem. Soc., 89-7, 4/1989, pp. 220-228.
Singh et al., "Oxidation of Silicon in the Presence of Chlorine and Chlorine Compounds", J. Electrochem. Soc., vol. 25, No. 3, Mar. 1978, pp. 453-461.

Primary Examiner—Olik Chaudhuri
Assistant Examiner—M. Wilczewski
Attorney, Agent, or Firm—Kenneth C. Hill; Richard K. Robinson

[57] ABSTRACT

A method for forming a thin oxide layer structure includes the step of first growing a dry oxide layer. A layer grown in steam and chlorine is formed next, followed by a final dry oxide layer. An anneal step in an inert gas further improves the quality of the oxide layer. The structure formed by such a process provides a layer of steam grown oxide sandwiched between two layers of oxide grown in a dry atmosphere.

12 Claims, 1 Drawing Sheet

THIN OXIDE STRUCTURE AND METHOD

BACKGROUND OF THE INVENTION

1. Field of the Invention

The present invention relates generally to semiconductor integrated circuit processing, and more specifically to a method for fabricating oxide structures on a semiconductor device.

2. Description of the Prior Art

Growth of thin oxides, such as used for the gates of field effect devices, is important to the functioning of such devices. The quality of the gate structure directly impacts device yields and reliability. The fact that the gate structure is so thin, typically on the order of 200Å to 500Å, makes it a difficult structure to produce reliably. Thin grown oxide structures are also used elsewhere in semiconductor devices, such as for capacitor dielectric structures.

Important properties of thin gate oxides and other thin oxide structures include the number of defects in the structure, such as pinhole density. Pinhole density affects both device yields and reliability in the field. The electric field density required to break down the thin oxide structure is also important to the reliability of the device.

It would be desirable to provide a method for forming a gate oxide or other thin insulating layer which has improved physical and electrical properties over such structures as are heretofor available.

SUMMARY OF THE INVENTION

It is therefore an object of the present invention to provide a thin oxide structure and method for growing same which has improved physical and electrical properties.

It is another object of the present invention to provide such a structure and method which is easily formed using standard process techniques and equipment.

It is a further object of the present invention to provide such a structure and method which is reliable and which is easily adaptable to providing oxide layers having a range of desired thicknesses.

Therefore, according to the present invention, a method for forming a thin oxide layer structure includes the step of first growing a dry oxide layer. A layer grown in steam and chlorine is formed next, followed by a final dry oxide layer. An anneal step in an inert gas further improves the quality of the oxide layer. The structure formed by such a process provides a layer of steam grown oxide sandwiched between two layers of oxide grown in a dry atmosphere.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
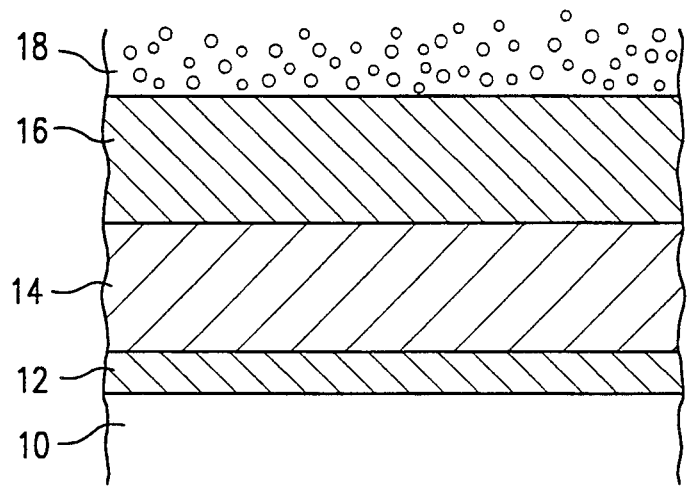
FIG. 1 is a cross-section of a portion of a gate oxide layer formed according to the present invention.

Referring to FIG. 1, a preferred embodiment of an improved gate oxide structure is shown. Field effect devices are formed in a substrate 10. An oxide layer 12 overlies the substrate layer 10, and is grown in a dry ambient. Oxide layer 14 overlies layer 12, and is grown in an ambient containing steam and chlorine gas as will be described in more detail below. Oxide layer 16 is also formed in a dry ambient. Polycrystalline gate layer 18 overlies oxide layer 16, and is used to form polycrystalline silicon gate structures as known in the art.

The combined thickness of the three oxide layers 12, 14, 16 will depend upon the size of the structures formed in the integrated circuit device, and the strength of the electric fields which will be generated between the polycrystalline silicon gate 18 and the substrate 10. For an integrated circuit having device geometries of approximately one micron or less, the combined thickness of the three oxide layers 12, 14, 16 could be, for example, 175Å. With such a structure, the oxide layer 16 and layer 14 each have a thicknesses of approximately 75Å, with oxide layer 12 having a thickness of approximately 25Å. If a thinner gate structure is desired, each of the layers 14 and 16 would be decreased somewhat in size. If a thicker gate oxide is desired, most of the increase is made in the thickness of layer 14. Layer 12 would also be made slightly thicker for such a structure.

Figure 2:
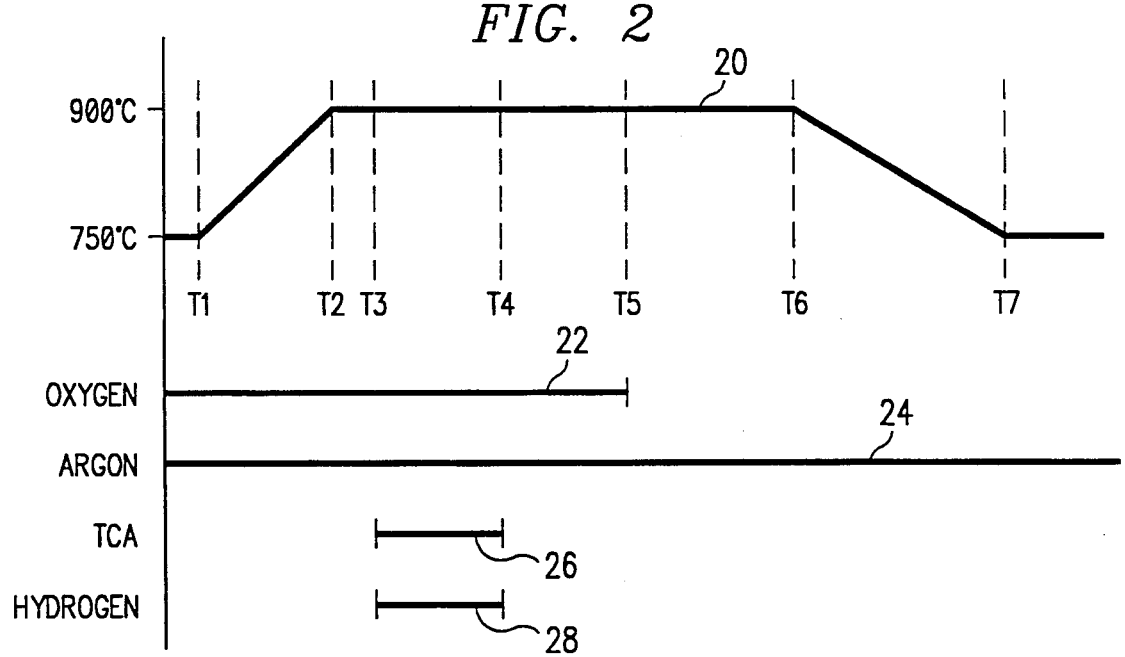
FIG. 2 is a diagram illustrating details of an oxidation cycle which can be used to grow the structure of FIG. 1.

FIG. 2 is a diagram illustrating a preferred operation for the furnace used to grow the gate oxide shown in FIG. 1. Temperature curve 20 indicates the temperature of the furnace at varying times. Times T1-T7 indicate times at which process changes occur as are described below.

Curve 22 indicates those times during which oxygen is flowing into the furnace. As shown, the oxygen flow ceases at time T5. Curve 24 indicates that argon is supplied for the duration of the process. Curves 26 and 28 indicate those times at which TCA (trichloroethylene) and hydrogen, respectively, are introduced into the furnace. As shown, this occurs between times T3 and T4 for both TCA and hydrogen. Trichloroethane can also be used to supply the chlorine for the oxidation.

The oxygen preferably has a flow rate of approximately 3 liters per minute, with argon having a flow rate of approximately 15 liters per minute. The TCA is provided as approximately a 3% solution suspended in oxygen, and is formed by bubbling the oxygen gas through liquid TCA at room temperature prior to its insertion into the furnace. The hydrogen flow rate is approximately 5.8 liters per minute. Prior to time T1, the furnace is loaded and the wafers are allowed to reach thermal equilibrium. The temperature of the furnace is then ramped up, preferably at a rate of approximately 5° C. per minute from 750° C. to 900° C. As known in the art, oxidation can be performed in the range of approximately 800° C. to 950° C., with a temperature of 900° C. being preferred in this embodiment. The temperature ramp up occurs between times T1 and T2, and takes 30 minutes. Oxidation continues between times T2 and T3, preferably for a period of approximately five minutes.

At time T3, dry oxide layer 16 has been grown to a thickness of approximately 75Å. The dilution of oxygen with argon provides for a relatively slow oxide growth rate during furnace load and ramp up, so that the thickness of layer 16 is more easily controlled.

Beginning at time T3, TCA is introduced, and steam is provided by introducing hydrogen. Both TCA and hydrogen are introduced into the furnace until time T4, which generates steam and causes the growth of wet oxide layer 14. At time T4, both TCA and hydrogen flow cease, and a dry oxidation cycle occurs up until time T5. This second dry oxidation cycle forms oxide layer 12. The oxygen flow is shut off at time T5, and an anneal step is performed for fifteen minutes until time T6. Between times T6 and T7, the furnace temperature is ramped down at a rate of 2.5° C. per minute, which takes a total of 60 minutes. The furnace temperature is then stabilized, and the furnace can be unloaded.

The times between T3 and T4, and between T4 and T5, are variable to provide different gate thicknesses as desired. For the 175Å gate shown in FIG. 1, the time period from T3 to T4 is ten minutes, and the time period from T4 to T5 is fifteen minutes. Growth of thicker gate oxides requires correspondingly longer times for both such time spans.

The formation of dry oxide layers 12 and 16 improves the interface with the substrate 10 and gate structure 18, respectively. The oxide layer 16 also protects the underlying silicon from damage caused by the chlorine during the wet oxide growth stage. Changing the oxide growth mechanism to steam between times T3 and T4 causes oxide to grow at a greater rate in areas which are thinner after the initial oxide growth step. This tends to smooth out the oxide layer overall, reducing the number of pinholes and other defects in the oxide layer.

The growth of the thin dry oxide layer 12, and the anneal step, combine to densify the steam grown oxide and reduce the number of trapping sites caused by hydroxyl groups. They also act to stabilize and anneal the interface with the underlying silicon by reducing the number of recombination-generation centers at the interface.

The improved, multi-layer gate oxide described above results in both improved yields and a decreased long term failure rate. Gate structures fabricated as described have a lower pinhole density, and a lesser number of defects, which tend to contribute to reliability problems. In addition, compared to a single step dry or wet grown oxide, the described multi-layer structure results in an oxide layer having an electric field breakdown voltage which is least approximately 10% higher.

Variations in the described process may be made while still taking advantage of the structure and method of the present invention. For example, hydrogen chloride gas can be used instead of TCA. As described above, the times required to form the various oxide layers can be varied as required. In addition, the gas flow rates and concentration ratios can be changed in order to accommodate variations in furnace design, and to meet other manufacturing requirements of a particular process flow.

During the fabrication of semiconductor devices, a layer of sacrificial oxide is often grown while various processing steps, such as ion implantation, are performed. This sacrificial layer is then removed before the actual gate oxide is grown. The sacrificial oxide can also be grown using the method described above, and results in devices having improved function. For example, the Kooi Effect is reduced when a sacrificial oxide layer is grown using the process described above.

The improved thin oxide grown by the process described above can also be used to fabricate higher quality dielectric layers for capacitors. This is especially useful when one plate of the capacitor is formed in the substrate, such as is common with many high density DRAM devices. It can also be used to grow an improved dielectric layer on top of a polycrystalline silicon layer.

While the invention has been particularly shown and described with reference to a preferred embodiment, it will be understood by those skilled in the art that various changes in form and detail may be made therein without departing from the spirit and scope of the invention.

What is claimed is:

1. A method for forming an insulating layer on an integrated circuit, comprising the steps of:
    introducing the integrated circuit into a furnace while oxygen and inert gas are flowing thereinto;
    increasing the temperature of the furnace to a desired level;
    holding the integrated circuit in the furnace for a first predetermined period of time;
    introducing hydrogen and a gas containing chlorine into the furnace for a second predetermined time;
    stopping the flow of hydrogen and the gas containing chlorine into the furnace, and holding the integrated circuit in the furnace for a third predetermined period of time;
    ceasing the flow of oxygen into the furnace, and holding the integrated circuit in the furnace for a fourth predetermined period of time;
    decreasing the furnace temperature; and
    removing the integrated circuit from the furnace.

2. The method of claim 1, wherein the gas containing chlorine is TCA.

3. The method of claim 1, wherein the gas containing chlorine is hydrogen chloride.

4. The method of claim 1, wherein the desired temperature level is in the range of approximately 800° C. to 950° C.

5. The method of claim 4, wherein the desired temperature level is approximately 900° C.

6. The method of claim 1, wherein the first preselected time is approximately five minutes, the second preselected time is approximately ten minutes, the third preselected time is approximately fifteen minutes, and the fourth preselected time is approximately fifteen minutes.

7. A method for forming an insulating layer on an integrated circuit, comprising the steps of:
    introducing the integrated circuit into a furnace;
    increasing the temperature of the furnace to a desired level while oxygen and inert gas are flowing thereinto;
    holding the integrated circuit in the furnace for a first predetermined period of time;
    introducing hydrogen and a gas containing chlorine into the furnace for a second predetermined time;

stopping the flow of hydrogen and the gas containing chlorine into the furnace, and holding the integrated circuit in the furnace for a third predetermined period of time;

ceasing the flow of oxygen into the furnace, and holding the integrated circuit in the furnace for a fourth predetermined period of time;

decreasing the furnace temperature; and removing the integrated circuit from the furnace.

8. The method of claim 7, wherein the gas containing chlorine is TCA.

9. The method of claim 7, wherein the gas containing chlorine is hydrogen chloride.

10. The method of claim 7, wherein the desired temperature level is in the range of approximately 800° C. to 950° C.

11. The method of claim 7, wherein the desired temperature level is approximately 900° C.

12. The method of claim 7, wherein the first preselected time is approximately five minutes, the second preselected time is approximately ten minutes, the third preselected time is approximately fifteen minutes, and the fourth preselected time is approximately fifteen minutes.

* * * * *